US006188335B1

(12) United States Patent
Roth et al.

(10) Patent No.: US 6,188,335 B1
(45) Date of Patent: Feb. 13, 2001

(54) METHOD AND APPARATUS HAVING CASCADED DECODING FOR MULTIPLE RUNLENGTH-LIMITED CHANNEL CODES

(75) Inventors: Ron M. Roth, Ramat Gan (IL); Josh N. Hogan, Los Altos, CA (US); Gitit Ruckenstein, Haifa (IL)

(73) Assignee: Hewlett-Packard Company, Palo Alto, CA (US)

( * ) Notice: Under 35 U.S.C. 154(b), the term of this patent shall be extended for 0 days.

(21) Appl. No.: 09/136,188

(22) Filed: Aug. 19, 1998

(51) Int. Cl.[7] .................................................. H03M 7/00
(52) U.S. Cl. ................................. 341/59; 341/106
(58) Field of Search ............................. 341/88, 59, 106; 714/767; 369/59; 382/245; 704/503

(56) References Cited

U.S. PATENT DOCUMENTS

| 5,535,187 | * | 7/1996 | Melas et al. ............................. 369/59 |
| 5,870,037 | * | 2/1999 | Okazaki et al. .................... 341/59 X |
| 6,009,549 | * | 12/1999 | Bliss ..................................... 714/769 |

OTHER PUBLICATIONS

El–Soudani, "Multistage Coding for Data Storage Systems," IEEE, 322–326, 1995.*

\* cited by examiner

Primary Examiner—Patrick Wamsley

(57) ABSTRACT

Two different (d,k)-RLL codes can be used in systems such as erasable and writable dense optical disks. This is because it is typically possible to make readers capable of reading information written at a higher resolution (by a short wavelength authoring system) than the resolution that can be written by a consumer writer (using a laser of the same or longer wavelength as the reader). For one embodiment, two different decoders are used to decode the data. Alternately, we present an encoding scheme which operates with a single decoder. In one case, $q_1 = q_2$ (and as a result $p_1 < p_2$), so that the decoders $D_1$ and $D_2$ actually process blocks of the same length. The decoding of the sequences encoded by $E_1$ is done using the decoder $D_2$ plus an additional function $\psi$ which maps the restored $p_2$-blocks into $p_1$-blocks in a to very simple manner. This way, we do not need a separate circuit for the $(d_1,k_1)$-RLL decoder, because $D_1$ is obtained as a cascading of $D_2$ and another very simple circuit $\psi$. For one embodiment, the decoder $D_2$ is a block decoder, and, consequently $D_1$ is also a block decoder. The conversion performed by the function $\psi$ is simply a removal of bits in fixed and pre-specified locations, thus getting the shorter $p_1$-block out of the $p_2$-block. The use of two coding schemes provides a method of making a lower performance recording system that produces recordings that are compatible with standard full performance readers. For example, this technique will allow a half capacity DVD to be written with a lower resolution system.

21 Claims, 2 Drawing Sheets

| addr. (dec.) | Contents of table (hexadecimal) | | | | | | | | | | | | | | | |
|---|---|---|---|---|---|---|---|---|---|---|---|---|---|---|---|---|
| | 0 | 1 | 2 | 3 | 4 | 5 | 6 | 7 | 8 | 9 | 10 | 11 | 12 | 13 | 14 | 15 |
| 0 | 0024 | 0021 | 0022 | 0042 | 2222 | 0020 | 2221 | 0040 | 2220 | 2224 | 0048 | 0084 | 0041 | 0049 | 0081 | 0102 |
| 16 | 0201 | 0249 | 0089 | 0202 | 0109 | 0111 | 0121 | 0082 | 0101 | 0091 | 0092 | 0080 | 0122 | 0124 | 0224 | 0100 |
| 32 | 0248 | 0112 | 0244 | 0104 | 0211 | 0221 | 0241 | 0208 | 0222 | 0242 | 0044 | 0088 | 0090 | 0209 | 0108 | 0110 |
| 48 | 0120 | 0204 | 0212 | 0210 | 0220 | 0240 | 0401 | 0422 | 0489 | 0491 | 0801 | 0442 | 0889 | 0891 | 0909 | 0842 |
| 64 | 0921 | 1049 | 0409 | 0404 | 0421 | 0441 | 0481 | 0804 | 0811 | 0821 | 0841 | 0402 | 0901 | 0881 | 0492 | 0802 |
| 80 | 0892 | 0912 | 0922 | 1004 | 0449 | 0849 | 0482 | 0440 | 0822 | 0911 | 0882 | 0410 | 0411 | 0412 | 0902 | 0420 |
| 96 | 0809 | 0484 | 0844 | 0820 | 0424 | 0890 | 0448 | 0808 | 0488 | 0490 | 0824 | 0810 | 0848 | 0884 | 0812 | 0888 |
| 112 | 0904 | 0908 | 0910 | 1088 | 0880 | 0480 | 0840 | 1110 | 0900 | 1089 | 1091 | 1002 | 1241 | 1121 | 1209 | 1102 |
| 128 | 1221 | 1009 | 1011 | 1022 | 1041 | 1081 | 1101 | 1082 | 1249 | 1109 | 1092 | 1044 | 1122 | 1212 | 1222 | 1104 |
| 144 | 1012 | 1021 | 1042 | 1084 | 1211 | 1202 | 0924 | 0408 | 1124 | 1024 | 0444 | 1008 | 1224 | 1244 | 1248 | 1010 |
| 160 | 1112 | 1048 | 1201 | 1020 | 1090 | 1242 | 0920 | 1108 | 1120 | 1204 | 1208 | 1040 | 1220 | 1210 | 1080 | 1100 |
| 176 | 1240 | 2089 | 2091 | 2102 | 2111 | 2121 | 2209 | 2022 | 2049 | 2241 | 2409 | 2202 | 2221 | 2441 | 2481 | 2004 |
| 192 | 2011 | 2021 | 2041 | 2008 | 2101 | 2201 | 2249 | 2010 | 2449 | 2489 | 2491 | 2020 | 2122 | 2212 | 2092 | 2088 |
| 208 | 2412 | 2422 | 2442 | 2100 | 2012 | 2211 | 2492 | 2082 | 2109 | 2411 | 2402 | 2042 | 2081 | 2401 | 2112 | 2110 |
| 224 | 2009 | 2244 | 2248 | 2210 | 2444 | 2448 | 2484 | 2044 | 2490 | 2488 | 2048 | 2080 | 2242 | 2090 | 2408 | 2108 |
| 240 | 2124 | 2120 | 2204 | 2208 | 2424 | 2024 | 2404 | 2104 | 2410 | 2420 | 2480 | 2080 | 2482 | 2240 | 2440 | 2040 |
| 256 | 4024 | 4021 | 4802 | 4042 | 4012 | 4920 | 4009 | 4040 | 4124 | 4810 | 4048 | 4044 | 4041 | 4049 | 4081 | 4102 |
| 272 | 4201 | 4249 | 4089 | 4202 | 4109 | 4111 | 4121 | 4082 | 4101 | 4091 | 4092 | 4080 | 4122 | 4224 | 4244 | 4100 |
| 288 | 4888 | 4112 | 4248 | 4104 | 4211 | 4221 | 4241 | 4208 | 4842 | 4242 | 4090 | 4088 | 4924 | 4209 | 4808 | 4220 |
| 304 | 4120 | 4804 | 4212 | 4210 | 4820 | 4240 | 4401 | 4422 | 4489 | 4491 | 4801 | 4442 | 4889 | 4891 | 4909 | 4222 |
| 320 | 4921 | 4011 | 4409 | 4404 | 4421 | 4441 | 4402 | 4204 | 4811 | 4821 | 4841 | 4402 | 4901 | 4881 | 4492 | 4022 |
| 336 | 4892 | 4912 | 4922 | 4084 | 4449 | 4849 | 4482 | 4440 | 4822 | 4911 | 4882 | 4410 | 4411 | 4412 | 4902 | 4420 |
| 352 | 4809 | 4484 | 4844 | 4110 | 4424 | 4890 | 4448 | 4108 | 4488 | 4490 | 4824 | 4408 | 4848 | 4884 | 4812 | 4010 |
| 368 | 4904 | 4908 | 4910 | 4020 | 4880 | 4480 | 4840 | 4008 | 4900 | 9089 | 9091 | 8022 | 9111 | 9121 | 9209 | 8422 |
| 384 | 9221 | 9009 | 9011 | 8442 | 9041 | 9081 | 9101 | 8842 | 9249 | 9109 | 9092 | 8884 | 9122 | 9212 | 9222 | 8444 |
| 400 | 9012 | 9021 | 9042 | 8844 | 9211 | 9202 | 8924 | 8208 | 9124 | 9024 | 9088 | 8220 | 9224 | 9244 | 9248 | 8410 |
| 416 | 9112 | 9048 | 9201 | 8420 | 9090 | 9242 | 9110 | 8020 | 9120 | 9204 | 9208 | 8840 | 9220 | 9210 | 9080 | 8880 |
| 432 | 9240 | 8489 | 8491 | 8822 | 8911 | 8921 | 8201 | 8222 | 8021 | 8041 | 8449 | 8382 | 8801 | 8849 | 8081 | 8204 |
| 448 | 8411 | 8221 | 8241 | 8088 | 8901 | 8209 | 8049 | 8210 | 8841 | 8089 | 8091 | 8408 | 8922 | 8012 | 9002 | 8010 |
| 464 | 8492 | 8402 | 8802 | 8440 | 8412 | 8011 | 9022 | 8482 | 8909 | 8401 | 9082 | 8092 | 8481 | 8441 | 8912 | 8910 |
| 480 | 8409 | 9008 | 8048 | 9108 | 8404 | 8120 | 8084 | 8244 | 9010 | 9004 | 8848 | 9044 | 8042 | 8890 | 8448 | 8908 |
| 496 | 8024 | 8920 | 8224 | 8248 | 9020 | 8124 | 8424 | 8904 | 8490 | 8484 | 8080 | 8082 | 8040 | 8100 | 9040 |
| 512 | 8824 | 8821 | 8122 | 8242 | 8112 | 8820 | 8809 | 8900 | 8104 | 8488 | 9084 | 9104 | 8811 | 8249 | 8881 | 8902 |
| 528 | 8211 | 8121 | 8889 | 9102 | 8101 | 9049 | 9241 | 8212 | 8109 | 8891 | 8892 | 8480 | 8202 | 8804 | 8044 | 8240 |
| 544 | 8108 | 8102 | 8808 | | | | | | | | | | | | | |

Combined table of the (2,10)–RLL and (3,10)–RLL encoders.

| addr. (dec.) | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| 0   | 0024 | 0021 | 0022 | 0042 | 2222 | 0020 | 2221 | 0040 | 2220 | 2224 | 0048 | 0084 | 0041 | 0049 | 0081 | 0102 |
| 16  | 0201 | 0249 | 0089 | 0202 | 0109 | 0111 | 0121 | 0082 | 0101 | 0091 | 0092 | 0080 | 0122 | 0124 | 0224 | 0100 |
| 32  | 0248 | 0112 | 0244 | 0104 | 0211 | 0221 | 0241 | 0208 | 0222 | 0242 | 0044 | 0088 | 0090 | 0209 | 0103 | 0110 |
| 48  | 0120 | 0204 | 0212 | 0210 | 0220 | 0240 | 0401 | 0422 | 0489 | 0491 | 0801 | 0442 | 0889 | 0891 | 0909 | 0842 |
| 64  | 0921 | 1049 | 0409 | 0404 | 0421 | 0441 | 0481 | 0804 | 0811 | 0821 | 0841 | 0402 | 0901 | 0881 | 0492 | 0802 |
| 80  | 0892 | 0912 | 0922 | 1004 | 0449 | 0849 | 0482 | 0440 | 0822 | 0911 | 0882 | 0410 | 0411 | 0412 | 0902 | 0420 |
| 96  | 0809 | 0484 | 0844 | 0820 | 0424 | 0890 | 0448 | 0808 | 0488 | 0490 | 0824 | 0810 | 0848 | 0884 | 0812 | 0888 |
| 112 | 0904 | 0908 | 0910 | 1088 | 0880 | 0480 | 0840 | 1110 | 0900 | 1089 | 1091 | 1002 | 1241 | 1121 | 1209 | 1102 |
| 128 | 1221 | 1009 | 1011 | 1022 | 1041 | 1081 | 1101 | 1082 | 1249 | 1109 | 1092 | 1044 | 1122 | 1212 | 1222 | 1104 |
| 144 | 1012 | 1021 | 1042 | 1084 | 1211 | 1202 | 0924 | 0408 | 1124 | 1024 | 0444 | 1008 | 1224 | 1244 | 1248 | 1010 |
| 160 | 1112 | 1048 | 1201 | 1020 | 1090 | 1242 | 0920 | 1108 | 1120 | 1204 | 1208 | 1040 | 1220 | 1210 | 1080 | 1100 |
| 176 | 1240 | 2089 | 2091 | 2102 | 2111 | 2121 | 2209 | 2022 | 2049 | 2241 | 2409 | 2202 | 2421 | 2441 | 2481 | 2004 |
| 192 | 2011 | 2021 | 2041 | 2008 | 2101 | 2201 | 2249 | 2010 | 2449 | 2489 | 2491 | 2020 | 2122 | 2212 | 2092 | 2088 |
| 208 | 2412 | 2422 | 2442 | 2100 | 2012 | 2211 | 2492 | 2082 | 2109 | 2411 | 2402 | 2042 | 2081 | 2401 | 2112 | 2110 |
| 224 | 2009 | 2244 | 2248 | 2210 | 2444 | 2448 | 2484 | 2044 | 2490 | 2488 | 2048 | 2084 | 2242 | 2090 | 2408 | 2108 |
| 240 | 2124 | 2120 | 2204 | 2208 | 2424 | 2024 | 2404 | 2104 | 2410 | 2420 | 2480 | 2080 | 2482 | 2240 | 2440 | 2040 |
| 256 | 4024 | 4021 | 4802 | 4042 | 4012 | 4920 | 4009 | 4040 | 4124 | 4810 | 4048 | 4044 | 4041 | 4049 | 4081 | 4102 |
| 272 | 4201 | 4021 | 4089 | 4202 | 4109 | 4111 | 4121 | 4082 | 4101 | 4091 | 4092 | 4080 | 4122 | 4224 | 4100 | 4100 |
| 288 | 4888 | 4112 | 4248 | 4104 | 4211 | 4221 | 4241 | 4208 | 4842 | 4242 | 4090 | 4088 | 4924 | 4209 | 4244 | 4220 |
| 304 | 4120 | 4804 | 4212 | 4210 | 4820 | 4240 | 4401 | 4422 | 4489 | 4491 | 4801 | 4442 | 4889 | 4891 | 4808 | 4222 |
| 320 | 4921 | 4011 | 4409 | 4404 | 4421 | 4441 | 4481 | 4204 | 4811 | 4821 | 4841 | 4402 | 4901 | 4881 | 4909 | 4022 |
| 336 | 4892 | 4912 | 4922 | 4084 | 4449 | 4849 | 4482 | 4440 | 4822 | 4911 | 4882 | 4410 | 4411 | 4412 | 4492 | 4420 |
| 352 | 4809 | 4484 | 4844 | 4110 | 4424 | 4890 | 4448 | 4108 | 4488 | 4490 | 4824 | 4408 | 4848 | 4884 | 4902 | 4010 |
| 368 | 4904 | 4908 | 4910 | 4020 | 4880 | 4480 | 4840 | 4008 | 4900 | 4820 | 4091 | 8022 | 9111 | 9121 | 4812 | 8422 |
| 384 | 9221 | 4021 | 9011 | 8442 | 9041 | 9081 | 9101 | 8842 | 9249 | 9089 | 9092 | 8884 | 9122 | 9212 | 9209 | 8444 |
| 400 | 9012 | 9021 | 9042 | 8844 | 9211 | 9202 | 8924 | 8208 | 8021 | 9109 | 9088 | 8220 | 9224 | 9244 | 9222 | 8410 |
| 416 | 9112 | 9048 | 9201 | 8420 | 9090 | 9242 | 9110 | 8020 | 8222 | 9024 | 9208 | 8840 | 9220 | 9210 | 9248 | 8880 |
| 432 | 9240 | 8489 | 8491 | 8822 | 8911 | 8921 | 8201 | 8222 | 8021 | 9204 | 8449 | 8882 | 8801 | 8849 | 9080 | 8204 |
| 448 | 8411 | 8221 | 8241 | 8088 | 8901 | 8209 | 8049 | 8210 | 8841 | 8041 | 8091 | 8408 | 8922 | 8849 | 8081 | 8010 |
| 464 | 8492 | 8402 | 8802 | 8440 | 8412 | 8011 | 9022 | 8482 | 8909 | 8089 | 9082 | 8092 | 8481 | 8012 | 9002 | 8010 |
| 480 | 8409 | 9008 | 8048 | 9108 | 8404 | 8120 | 8084 | 8244 | 9010 | 8401 | 9088 | 9044 | 8042 | 8441 | 8912 | 8908 |
| 496 | 8024 | 8920 | 8224 | 8248 | 9020 | 8124 | 8424 | 8904 | 8490 | 9004 | 8848 | 9100 | 8082 | 8890 | 8448 | 9040 |
| 512 | 8824 | 8821 | 8122 | 8242 | 8112 | 8820 | 8809 | 8900 | 8104 | 8484 | 8080 | 9104 | 8811 | 8040 | 8100 | 8902 |
| 528 | 8211 | 8121 | 8889 | 9102 | 8101 | 9049 | 9241 | 8212 | 8109 | 8488 | 9084 | 9480 | 8202 | 8249 | 8881 | 8902 |
| 544 | 8108 | 8102 | 8808 |     |     |     |     |     |     | 8891 | 8892 |     |     | 8804 | 8044 | 8240 |

*Figure 4* Combined table of the (2,10)-RLL and (3,10)-RLL encoders.

METHOD AND APPARATUS HAVING CASCADED DECODING FOR MULTIPLE RUNLENGTH-LIMITED CHANNEL CODES

BACKGROUND OF THE INVENTION

1. Field of the Invention

This invention relates to a system for encoding binary data words into codewords that satisfy prescribed constraints for transmission or storage and thereafter for decoding the codewords into the original binary data words. In particular, this invention relates to a system of encoding and decoding data which permits cascaded decoding for multiple codes.

2. Description of Related Art

In digital transmission systems and in magnetic and optical recording/playback systems, the information to be transmitted or to be recorded is presented as a bit stream sequence of ones and zeros. In optical and magnetic recording systems, the bit stream written into the device must satisfy certain constraints. A common family of constraints are the (d,k) runlength-limited (RLL) constraints, which specify that the run of zeros between consecutive ones in the bit stream must have a length of at least d and a length of no more than k for the prescribed parameters d and k. Currently, it is common for a compact disk or DVD (digital versatile disc) to use a code with the constraint (d,k)=(2, 10). An example of a sequence satisfying the (2,10) constraint is . . . 000100000000000100100000100 . . . in which the first four runlengths are 3,10,2 and 5. Magnetic recording standards include the (1,7)-RLL constraint, the (1,3)-RLL constraint and the (2,7)-RLL constraint.

The set of all sequences satisfying a given (d,k)-RLL constraint can be described by reading off the labels of paths in the labeled directed graph as shown in FIG. 1. The parameter k is imposed to guarantee sufficient sign changes in the recorded waveform which are required for clock synchronization during read-back. The parameter d is required to minimize inter-symbol interference.

Another type of constraint requires controlling the low frequency or DC component of the input data stream. The DC control is used in optical recording to avoid problems such as interference with the servo system and to allow filtering of noise resulting from finger-prints. Information channels are not normally responsive to direct current and any DC component of the transmitted or recorded signal is likely to be lost. Thus, the DC component of the sequence of symbols should be kept as close to zero as possible, preferably at zero. This can be achieved by requiring the existence of a positive integer B such that any recorded sequence $w_1 w_2 \ldots w_l$ now regarded over the symbol alphabet $\{+1,-1\}$ will satisfy the inequality $$\left| \sum_{h=i}^{j} w_h \right| \leq B$$

for every $1 \leq i \leq j \leq l$. Sequences that obey these conditions are said to satisfy the B-charge constraint. The larger the value of B, the less reduction there will be in the DC component.

However, in certain applications, the charge constraint can be relaxed, thus allowing higher coding rates. In such applications, the DC control may be achieved by using a coding scheme that allows a certain percentage of symbols (on the average) to reverse the polarity of subsequent symbols. Alternatively, DC control may be achieved by allowing a certain percentage of symbols on average to have alternate codewords with a DC component which is lower or of opposite polarity.

DC control and (d,k)-RLL constraints can be combined. In such schemes, the constraint of binary sequences $z_1 z_2 z_3 \ldots z_l$ that satisfy the (d,k)-RLL constraint, such that the respective NRZI sequences $$(-1)^{z_1}(-1)^{z_1+z_2}(-1)^{z_1+z_2+z_3} \ldots$$

have a controlled DC component.

Referring to FIG. 2 shows a functional block diagram of a conventional encoding/decoding system 200. In a typical example of audio data recorded onto a CD, analog audio data from the left and right audio inputs 202a, 202b of a stereo system are converted into 8 bit data signals which are input into a data scrambler and error correction code generator whose output 210 is transmitted into an encoder 212 comprised of a channel encoder 214 and a parallel-to-serial converter 216. The serial data 220 is written to a compact disk 222. A similar process is used to decode data from the CD. Data 224 from the CD is input into a decoder 230 comprised of a serial to parallel converter 230 and a channel decoder 232. Data from the CD is decoded, input into an error corrector and descrambler 238 and output as audio data 240.

The encoder 212 is a uniquely-decodable (or lossless) mapping of an unconstrained data stream into a constrained sequence. The current standard for encoding compact disk data is eight-to-fourteen modulation (EFM). Using EFM encoding, blocks of 8 data bits are translated into blocks of 14 data bits, known as channel bits. EFM uses a lookup table which assigns an unambiguous codeword having a length of 14 bits to each 8-bit data word. By choosing the right 14-bit words, bit patterns that satisfy the (2, 10) constraint, high data density can be achieved. Three additional bits called merge bits are inserted between the 14 bit codewords. These three bits are selected to ensure the (2, 10) constraint is maintained and also to control the low frequency or DC content of the bit stream. The addition of these three merge bits makes the effective rate of this coding scheme 8:17 (not 8:14).

The standard for encoding DVD data is the EFMPlus scheme. (See, for example, K. A. S. Immink, "EFMPlus: The coding format of the multimedia compact disc," IEEE Transactions on Consumer Electronics 41 (1995), pp. 491–497.) Using EFMPlus encoding, blocks of 8 data bits are translated into 16 bits by a four-state finite-state machine that uses a look-up table of size 1,376. By judiciously selecting the codewords in the table and by keeping track of the states, the (2, 10)-RLL constraint is maintained, along with control of the DC content of the output bit stream.

Demands for higher data density are increasing with the advent of multimedia, graphics-intensive computer applications and high-quality digital video programming. European Patent Application 96307738.3, Ron M. Roth, entitled "Method and Apparatus for Generating Runlength-limited Coding with DC Control", published May 2, 1997, as EP 0 771 078 A2, describes a lossless coding scheme that maps unconstrained binary sequences into sequences that obey the (d,k)-RLL constraint while offering a degree of DC control. The lossless coding scheme provides a method and apparatus for encoding and decoding binary data which increases information density relative to EFM coding and minimizes the overall DC component of the output constrained sequences. Further, the coding scheme attempts to minimize the memory required for the encoding and decoding tables. Memory size is decreased compared to the EFM and EFM-Plus coding schemes. Specifically, in the (2, 10)-RLL case, the table size is only 546 codewords.

In Roth, the channel encoder is a state machine which uses a single "overlapping" table for all states rather than using multiple tables. Recognizing that a subset of codewords in a first state $x_i$ are identical to a subset of codewords in the second state $x_j$, the overlapping encoding table uses identical addresses for the subset of identical codewords in the first and second state. Thus addresses for more than one state may point to a single codeword. A number of input bytes can be encoded into two different codewords which have different parity of ones, thus allowing for DC control. Decoding is carried out in a state-independent manner.

The encoder is a finite-state machine that maps input blocks to codewords. The encoder design is based on a method of choosing codewords and their sequence using state splitting, state merging and state deletion techniques such that a single table may be constructed for mapping unconstrained binary sequences into sequences that obey a (d,k) runlength constraint (here with d=2 and k=10, or 12) and a fixed-rate (either 8:16 or 8:15). The encoder is a finite-state machine consisting of four or more states. The encoder can achieve DC Offset control by choosing between output codewords with opposite "parity."

The main building block of the encoder is a table of codewords that serves all states. It has a simple addressing scheme for selection of a codeword or its opposite parity codeword, which simplifies the address circuitry. Encoding is carried out by prefixing the input block with a fixed number of bits which depend on the current encoder state and on comparing the input block to thresholds which are specified, as part of the encoder structure, by fixed threshold tables. The result is an address to the table from which the current encoded codeword is taken. Assuming random input, the probability of being at any given state is independent of the previous state, which allows advantage to be taken of the statistical randomness of the data.

The encoder features DC control by allowing for a number of input blocks to have two possible encoded codewords. The parity (number of 1's) is different in the two possible codewords and so the respective NRZI sequences end with a different polarity, thus allowing the reversal of the polarity of subsequent codewords. The ability to replace codewords with codewords of opposite polarity allows control of the accumulating DC offset. Because the "final bits" or "final run" of all codewords and their opposite parity codewords are matched, subsequent encoding is not affected by which is chosen (a codeword or its opposite parity mate). This facilitates using "look ahead" to optimize DC control. In those cases where DC control is possible, the address of the alternate codeword is obtained by adding a fixed number to the computed address.

By using a single "overlapping" table for all states rather than using multiple tables, the Roth encoder and decoder system has many advantages over prior systems. However, the particular single table to be used by Roth is specific to a particular coding scheme. In some cases, one may need to encode or decode binary sequences using more than one possible coding scheme. One approach would be to have more than one encoder or decoder, i.e., have a separate encoder or decoder for each scheme. The duplication required with such an approach increases attributes associated with the encoder or decoder system such as cost, size, and the like.

A method and apparatus of encoding and decoding binary data is needed which permits encoding and decoding using multiple coding schemes, but which employs single encoding and decoding tables.

SUMMARY OF THE INVENTION

The present invention describes a method and apparatus of encoding and decoding binary data which permits encoding and decoding using multiple coding schemes, and which may employ single encoding or decoding tables.

Two different (d,k)-RLL codes can be used in systems such as erasable and writable dense optical disks. This is because it is typically possible to make readers capable of reading information written at a higher resolution (by a short wavelength authoring system) than the resolution that can be written by a consumer writer (using a laser of the same or longer wavelength as the reader). For example, sequences can be encoded either by a $(d_1,k_1)$-RLL encoder $E_1$ at the rate of $p_1:q_1$ or by a $(d_2,k_2)$-RLL encoder $E_2$ at the rate of $p_2:q_2$, where $d_1 \geq d_2$ and $k_1 \leq k_2$. The last two constraints on the parameters imply that sequences which satisfy the $(d_1,k_1)$-RLL constraint also satisfy the $(d_2,k_2)$-RLL constraint, but not necessarily vice versa. The rate $p_1/q_1$ is thus smaller than the rate $p_2/q_2$.

For one embodiment, two different decoders are used to decode the data, a $(d_1,k_1)$-RLL decoder $D_1$, which is used if the encoding is done by $E_1$, and a $(d_2,k_2)$-RLL decoder $D_2$, which is used if the encoding is done by $E_2$. Alternately, we present an encoding scheme which operates with a single decoder. In this case, the idea is to have $q_1=q_2$ (and as a result $p_1<p_2$), so that the decoders $D_1$ and $D_2$ actually process blocks of the same length. The decoding of the sequences encoded by $E_1$ is done using the decoder $D_2$ plus an additional function $\psi$ which maps the restored $p_2$-blocks into $p_1$-blocks in a very simple manner. This way, we do not need a separate circuit for the $(d_1,k_1)$-RLL decoder, because $D_1$ is obtained as a cascading of $D_2$ and another very simple circuit $\psi$.

For one embodiment, the decoder $D_2$ is a block decoder, and, consequently $D_1$ is also a block decoder. The conversion performed by the function $\psi$ is simply a removal of bits in fixed and pre-specified locations, thus getting the shorter $p_1$-block out of the $p_2$-block.

The use of two coding schemes permits one to make a lower resolution recording system to augment a higher resolution player. For example, it is typically possible to make readers capable of reading information written at a higher resolution (by a short wavelength authoring system) than the resolution that can be written by a consumer writer (using a laser of the same or longer wavelength as the reader). The encoder can be restricted to using only a subset of codewords, which have some desirable property, by locating codewords with this property at particular locations within the code table and using a modified threshold table to ensure the property is preserved when codewords are concatenated.

An example of this technique would be to only use codewords that satisfy a (3, 10) constraint, instead of the (2, 10) constraint. This could be achieved by locating codewords that did not contain the "1001" sequence and that did not end in "1" at every fourth location in the code table. The threshold table would be modified to ensure that no "1001" sequence occurred when codewords were concatenated. Ensuring that only every fourth codeword is accessed is accomplished by inserting an additional two predetermined binary digits after every six binary digits of the original symbol sequence. This reduces the effective data rate of the system, However, the smallest mark that is now made corresponds to "10001" rather than "1001", which can be written by a lower resolution system. This provides a method of making a lower performance recording system that produces recordings that are compatible with standard full performance readers. For example, this technique will allow a half capacity DVD (digital versatile disc) to be written with a lower resolution system.

BRIEF DESCRIPTION OF THE DRAWINGS

FIG. 4 shows a combined coding table for a (2, 10)-RLL and (3, 10)-RLL coder according to the present invention.

DETAILED DESCRIPTION OF THE PREFERRED EMBODIMENTS

The present invention provides a method and apparatus for a scheme of cascaded decoding for two (d,k)-RLL codes.

Introduction

In secondary storage systems, it is usually required that the binary sequences stored in a device satisfy certain constraints. The most common family of constraints is the (d,k)-RLL constraints, where each run of zeroes between two consecutive ones should be not shorter than d and not longer than k. Arbitrary input sequences are thus encoded into sequences satisfying the constraint.

An encoding model which is commonly used for this matter is the one of finite-state fixed rate encoders, where the input sequence is divided into blocks of a fixed length p, and each of them is replaced with an output block depending only on the p-block itself and on the internal state of the encoder. The output blocks are all of the same fixed length q and their concatenation forms a sequence satisfying the constraint.

To make decoding possible, the encoder should be lossless, which means that no two input sequences are encoded into the same output sequence. If the encoder is lossless, we can always design a decoder that uses the sequence of the output q-blocks in order to reconstruct the path through which the encoder passed, including the p-blocks encoded at any stage. This is a state-dependent decoder.

There are cases where the knowledge of several upcoming q-blocks is necessary for the decoder in order to restore the p-block corresponding to the current processed q-block. We would like this look-ahead of the decoder to be the smallest possible. Another advantageous property of a decoder is state-independence, meaning that the p-block corresponding to the current processed q-block is not a function of the encoder state at which this p-block was encoded.

A decoder that is state-independent and does not need any look-ahead is called a block decoder. Block decoding is simply done according to a table which maps every q-block to a certain p-block. An encoder for which there exists a corresponding block decoder is considered a block decodable encoder. Whether a block decodable encoder exists depends on the specific constraint, i.e., on d and k, and on the parameters p and q.

Two different (d,k)-RLL codes can be used in the new technology of erasable and writable dense optical disks. Sequences will be encoded either by a $(d_1,k_1)$-RLL decoder $E_1$ at the rate of $p_1{:}q_1$ or by a $(d_2,k_2)$-RLL encoder $E_2$ at the rate of $p_2{:}q_2$, where $d_1 \geq d_2$ and $k_1 \leq k_2$. The last two constraints on the parameters imply that sequences which satisfy the $(d_1,k_1)$-RLL constraint also satisfy the $(d_2,k_2)$-RLL constraint, but not necessarily vice versa. The rate $p_1/q_1$ is thus smaller than the rate $p_2/q_2$.

Figure 1:
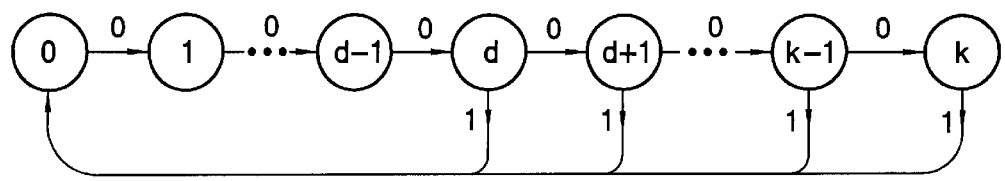
FIG. 1 shows a graphical representation of a (d,k)-RLL constraint.
Figure 2:
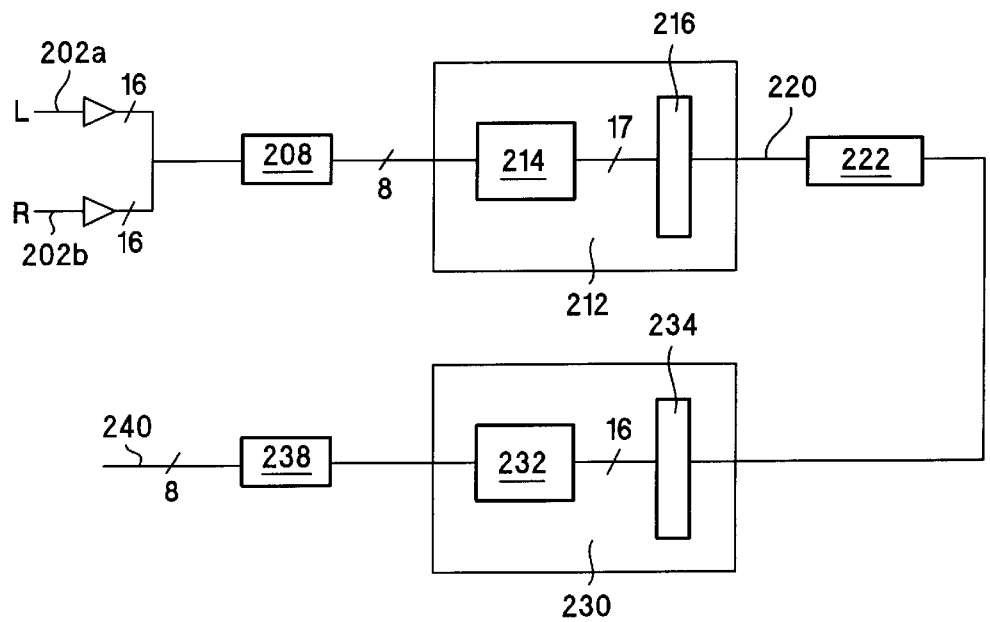
FIG. 2 shows a functional block diagram of a conventional encoding/decoding system.
Figure 3:
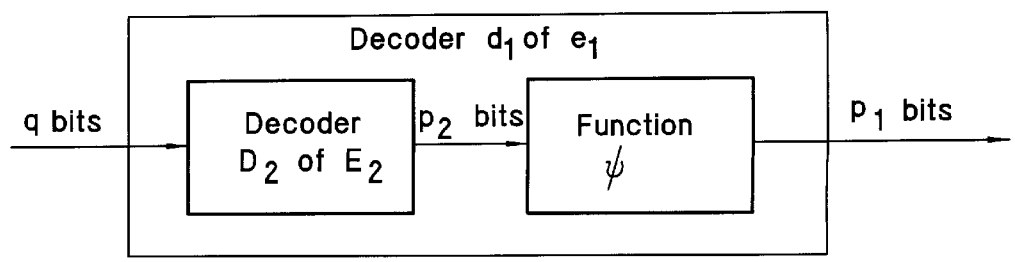
FIG. 3 shows a functional block diagram of a cascaded decoder according to the present invention.

In order to decode the data we could have two different decoders, a $(d_1,k_1)$-RLL decoder $D_1$, which is used if the encoding is done by $E_1$, and a $(d_2,k_2)$-RLL decoder $D_2$, which is used if the encoding is done by $E_2$. In this work, we present an encoding scheme which allows to manage with a single decoder. In one case, the idea is to have $q_1=q_2$ (and as a result $p_1 \leq p_2$), so that the decoders $D_1$ and $D_2$ actually process blocks of the same length. The decoding of the sequences encoded by $E_1$ is done using the decoder $D_2$ plus an additional function $\psi$ which maps the restored $p_2$-blocks into $p_1$-blocks in a very simple manner. This way, we do not need a separate circuit for the $(d_1,k_1)$-RLL decoder, because $D_1$ is obtained as a cascading of $D_2$ and another very simple circuit $\psi$, as shown in FIG. 3.

The decoder $D_2$ in our case is a block decoder, and, consequently $D_1$ is also a block decoder. The conversion performed by the function $\psi$ is simply a removal of bits in fixed and pre-specified locations, thus getting the shorter $p_1$-block out of the $p_2$-block.

Our construction requires the parameters $d_1$, $k_1$, $d_2$, $k_2$, and q to satisfy certain conditions. However, under these conditions, our construction works wherever the parameters $d_1$, $k_1$, $p_1$, and q allow the existence of a block decodable $(d_1,k_1)$-RLL encoder and the parameters $d_2$, $k_2$, p2, and q allow the existence of a block decodable $(d_2,k_2)$-RLL encoder. Furthermore, our construction is applicable in the case of (3, 10)-RLL and (2, 10)-RLL constraints, which is a case of particular interest, as will be seen in the practical examples below. The construction is based on an encoding scheme due to Fuja and Gu (see, J. Gu, T. E. Fuja, *A new approach to constructing optimal block codes for runlength-limited channels*, IEEE Trans. Inform. Theory, 40 (1994), 774–785).

Definition of the Encoders

Given a (d,k)-RLL constraint and integers q, l, and r, we define L(q,d,k,l,r) to be the set of all binary words of length q that satisfy the (d,k)-RLL constraint and, in addition, start with at least l zeroes and no more than k zeroes, and end with no more than r zeroes. We denote by f(q,d,k,l,r) the cardinality of the set L(q,d,k,l,r). Both L(q,d,k,l,r) and f(q,d,k,l,r) can be computed using recursive procedures (see Fuja and Gu). We also define $\Delta(d,k)$ to be $k-d+1$. For a q-block w, we denote by l(w) the number of zeroes located to the left of the leftmost "1".

In order to use our scheme for the $(d_1,k_1)$-RLL and the $(d_2,k_2)$-RLL constraints at the rates of $p_1{:}q$ and $p_2{:}q$, respectively, the parameters should satisfy the following inequality:

$q > k_2 \geq k_1 \geq 2d_1 \geq 2d_2 \geq 2$

Define $n_1 = f(q,d_1,k_1,d_1,\{k_1-1\})$ and $n_2 = f(q,d_2,k_2,d_2,k_2-1)$. It is required that $n_1 \geq 2^{p_1}$ and that $n_2 \geq 2^{p_2}$. Otherwise, as shown in Fuja and Gu, there do not exist block-decodable encoders for the $(d_1,k_1)$-RLL and the $(d_2,k_2)$-RLL constraints at the specified rates.

We first assume that $d_2 > 1$. The case of $d_2 = 1$ is treated in a later section.

We construct a table $\{TC_1(j)\}$ for $j=0$ to $(n_1-1)$ containing all the $n_1$ different q-blocks in $L(q,d_1,k_1,d_1,k_1-1)$, ordered arbitrarily. Let $l_1(j)$ denote the length $l(TC_1(j))$. If $l_1(j) > \Delta(d_1,k_1)$, then we define $\phi(TC_1(j))$ to be the q-block obtained from $TC_1(j)$ by inverting the zero at location $l_1(j)-\Delta(d_1, k_1)+1$ from left.

A second table $\{TC_2(j)\}$ for $j=0$ to $(n_2-1)$ contains all the $n_2$ different q-blocks in $L(q,d_2,k_2,d_2,k_2-1)$. The q-blocks stored in $TC_2$ are ordered so that they satisfy the following two conditions:

For $j=0, \ldots n_1-1$, $TC_2(j)=TC_1(j)$.
For $j=n_1, \ldots, n_2-1$, if $TC_2(j)=\phi(TC_1(t))$ for some t, then $j=t+2^{p-1}$.

Let $l_2(j)$ denote the length $l(TC_2(j))$. If $l_2(j)>\Delta(d_2,k_2)$, then we define $\phi(TC_2(j))$ to be the q-block obtained from $TC_2(j)$ by inverting the zero at location $l_2(j)-\Delta(d_2,k_2)+1$ from left.

We now define two additional tables of q-blocks, $TB_1$ and $TB_2$, of sizes $n_1$ and $n_2$, respectively. The q-blocks stored in these two tables are defined by the following four steps. Notice that for $j<n_1$ the q-blocks $TB_1(j)$ and $TB_2(j)$ coincide.

Step 1: For $0 \leq j<n_1$, if $l_1(j)=\Delta(d_1,k_1)+1$, we define $TB_1(j)$ to be $\phi(TC_1(j))$. The q-block $TB_2(j)$ is defined to be $TB_1(j)$.

Step 2: For $0 \leq j<n_2$, if $l_2(j)=\Delta(d_2,k_2)+1$, we define $TB_2(j)$ to be $\phi(TC_2(j))$. If $j<n_1$, we also define $TB_1(j)$ to be $TB_2(j)$.

Step 3: The rest of the q-blocks $TB_1(j)$ are defined according to the following rules:

If $l_1(j)>d_1$, we get $TB_1(j))$ by inverting the leftmost (first) zero in $TC_1(j)$.

If $l_1(j)=d_1$, we choose $TB_1(j)$ to be a q-block w of $L(q,d_1,k_1,0,k_1-1)$ with $l(w) \leq 1$ that has not been included yet either in $TC_1$ or in $TB_1$.

If $k_1=\Delta(d_2,k_2)-1$ or $k_1=\Delta(d_2,k_2)$, we do not choose q-blocks starting with "01" and a second run of zeroes of length $\Delta(d_2,k_2)-1$.

Step 4: The rest of the q-blocks $TB_2(j)$ are defined according to the following rules:

If $j<n_1$, we define $TB_2(j)$ to be $TB_1(j)$.

Otherwise, $TB_2(j)$ is chosen to be a q-block w of $L(q,d_1,k_1,0,k_2-1)$ with $l(w) \leq 1$ which has not been included yet either in $TC_2$ or in $TB_2$.

The states of the encoder $E_i$ (i=1, 2) are denoted by $0,1,\ldots, k_i-d_i$. After generating an output q-block whose rightmost run of zeroes is of length s, the new encoder state is defined to be s.

Let us denote by $bin_p(j)$ the binary representation of the integer j using p bits. Given the $p_i$-block $bin_{p-i}(j)$ and the current state s of the encoder $E_i$, the encoding is done as follows:

The q-block $TC_i(j)$ is taken from $TC_i$. Then, depending on $l_i(j)$ and on the encoder state s, it is decided whether to generate as output the q-block $TC_i(j)$ itself, the q-block $TB_i(j)$, or the q-block $\phi(TC_i(j))$ as follows. (The q-block $\phi(TC_i(j))$, if needed, is obtained by inverting the zero at place $l_i(j)-\Delta(d_i,k_i)+1$ from left.) We define the following three cases:

Case 1: $d_i \leq l_i(j) < \Delta(d_i,k_i)+1$.
  If $0 \leq s \leq k_i-l_i(j)$, then $TC_i(j)$ is generated as output.
  If $k_i-l_i(j)+1 \leq s \leq k_i-1$, then $TB_i(j)$ is generated as output.
Case 2: $l_i(j)=\Delta(d_i,k_i)+1$.
  If $0 \leq s \leq k_i-l_i(j)$, then $TC_i(j)$ is generated as output.
  If $k_i-l_i(j)+1 \leq s \leq k_i-1$, then $\phi(TC_i(j))$ is generated as output.
Case 3: $\Delta(d_i,k_i)+1 < l_i(j) \leq k_i$.
  If $0 \leq s \leq k_i-l_i(j)$, then $TC_i(j)$ is generated as output.
  If $k_i-l_i(j)+1 \leq s \leq d_i-1$, then $\phi(TC_i(j))$ is generated as output.
  If $d_i \leq s \leq k_i-1$, then $TB_i(j)$ is generated as output.

Decoding

Given a q-block w, the block decoder $D_2$ operates as follows:

If $l(w) \geq d_2$, $D_2$ generates as output the $p_2$-block $bin_{p2}(j)$, where j is the index for which $TC_2(j)=w$.

If $1<l(w)<d_2$, then the leftmost one in w is inverted, yielding a new q-block w'. The decoder $D_2$ generates as output the $p_2$-block $bin_{p-2}(j)$, where j is the index for which $TC_2(j)=w'$.

If $l(w) \leq 1$, then $D_2$ generates as output the $p_2$-block $bin_{p-2}(j)$, where j is such that $TB_2(j)=w$.

The decoder $D_1$ is a cascading of $D_2$ and the function $\psi$. Given the $p_2$-block generated by $D_2$, the function $\psi$ simply removes the $p_2-p_1$ most significant bits of the $p_2$-block, yielding the correct $p_1$-block.

The Case of $d_2=1$

The only difference is in the definition of the tables $TB_1$ and $TB_2$. If $d_1>1$, then $TB_1$ is constructed independently of $TB_2$, satisfying the relevant rules presented through Steps 1–4. If $d_1=1$, then $TB_1(j)$ should be defined only if $l(TC_1(j))>1$, and in this case $TB_1(j)$ is simply $TC_1(j)$ with its leftmost zero inverted.

The q-block $TB_2(j))$ should be defined only if $l(TC_2(j))>1$. For $j<n_1$, if $l(TB_1(j))=0$, then we define $TB_2(j)=TB_1(j)$. As for the remaining entries in $TB_2$, the q-block $TB_2(j)$ can be any q-block w from $L(q,d_2,k_2,0,k_2-1)$ with $l(w)=0$ which has not been included yet in $TB_2$.

Practical Application: Low Resolution Writing

As previously described, a channel coding scheme for mapping unconstrained 8 bit binary words into a bit sequence that obeys a run length limited constraint, for example (2, 10), has been developed by Roth. The scheme uses a single table in which codewords are carefully located, on the basis of their code beginning, and a four state machine that employs a threshold table. The combination of locating the code words and choosing the threshold values, ensures the RLL constraint is met and in addition allows control over the DC content.

The nature of this coding scheme facilitates other properties being imposed upon the bit stream, by further controlling the location of codewords and manipulating the threshold tables. A method for making a lower resolution recording system is given below as a practical example.

A Method for Making a Lower Resolution Recording System

The encoder can be restricted to using only a subset of codewords, which have some desirable property, by locating codewords with this property at particular locations within the code table and using a modified threshold table to ensure the property is preserved when codewords are concatenated.

An example of this technique would be to only use codewords that satisfy a (3, 10) constraint, instead of the (2, 10) constraint. This could be achieved by locating codewords that did not contain the "1001" sequence and that did not end in "1" at every fourth location in the code table. The threshold table would be modified to ensure that no "1001" sequence occurred when codewords were concatenated. Ensuring that only every fourth codeword is accessed is accomplished by inserting an additional two predetermined binary digits after every six binary digits of the original symbol sequence. This reduces the effective data rate of the system, However, the smallest mark that is now made corresponds to "10001" rather than "1001", which can be written by a lower resolution system. This provides a method of making a lower performance recording system that produces recordings that are compatible with standard full performance readers. This could allow a half capacity DVD, digital versatile disc, (½ DVD) to be written with a lower resolution system.

Example of Lower Resolution Recording Scheme to Write a ½ Capacity DVD

There is some technical risk involved with attempting to achieve the capability of writing the small spot size required by the DVD readers. The minimum pit size along the direction of the track is the most formidable challenge, having a minimum pit length of 400 nm. By excluding bit patterns which contain the sequence 1001 from the encoding process, i.e. by replacing the (2, 10) RLL constraint with that of a (3, 10) RLL constraint the minimum pit length to be written would be 530 nm. Using the λ/2NA criterion, a 400 nm spot requires λ=480 nm, whereas a 530 nm spot size requires λ=636 nm, which is available. (Note this spot size limit may be reduced by pulsing the laser source, but the general principle of loosening the specification is still valid.) This (3, 10) constraint may be required for only the active writing cycle, having the laser in erase mode for a 1001 may be acceptable. This means that while the laser may not have a small enough of a spot to melt a 1001 spot, it may be able to leave a spot as small as 1001. This version would require careful regulation of polarity so that active writing would never involve a 1001 mark. In any event, there would be data capacity reduction associated with this additional (3, 10) constraint.

In order to achieve the (3, 10) goal the data symbols sequence should be re-mapped to one that only contains symbols from a subset that can be encoded with the (3, 10) codes. That is, the encoder table should be organized such that it maps the symbol subset to codewords that do not contain "1001" i.e. they belong to the (3, 10) subset. The encoder should also ensure that concatenating codes from the (3, 10) subset does not violate the (3, 10) constraint.

An example of how a scheme satisfying the above requirements is now described. It is based on a variation of the proposed HP channel code, which does allow syncs that satisfy the (3, 10) constraint.

A data block would contain only 16 KBytes of user data (as opposed to 32 K normally). The block would be similar to a regular 32 K block, but the symbols would be generated in a different manner. Each line would consist of 126 data symbols (user data and header, etc.). These symbols would be mapped to 168 symbols by taking each six bits from the original sequence and two zeros in fixed locations, say the first two locations. This produces 168 symbols all of which start with 00. The ECC calculation would now have to be made using only the 64 word alphabet that contains bytes that start with "00". This would require more redundant bytes for the same ECC protection. (14 instead of 10 for ECC1).

Alternatively the "00"s could be added to the bit stream after the ECC bytes have been calculated. This would simplify matters, but it would require the reader to know whether it was reading a DVD or ½ DVD disk.

The choice of "00" as a prefix is preferable for ECC encoding, because it maintains the linearity of the code. On the other hand, it turns out that the RLL encoder becomes simpler if, instead of that prefix, we will have a suffix "11". This can be easily accomplished by reversing and inverting all symbols generated by the ECC encoder before entering the RLL encoder.

Ensuring that the symbols all belong to the above subset (ending in "11"), effectively determines that only every fourth codeword in the encoder table is ever accessed. There are over 200 codewords that are (3, 10) compatible. The positions of the codewords in the encoder table are now re-arranged such that, only codewords from the (3, 10) subset are located at every fourth address. This is in addition to the original constraints for (2, 10) RLL and DC control. Furthermore the codewords from the (3, 10) subset must obey the (3, 10) constraint. This requirement requires further codeword repositioning to ensure no "fourth" codeword ends in a "1" and adjusting the thresholds, which have a consequent reduction in DC control. This threshold adjustment would only be required for the ½ DVD encoder and the loss of DC control may be compensated for by some additional techniques (e.g. selecting the zero words or allowing optional other two bit endings or the very act of not using codewords that lead to state 1 may be sufficient).

One should note that according to this scheme, there is a slight reduction in ECC protection because the 8:16 modulation code no longer matches data symbols. However, if a 16K data block is used, there is overhead available for additional (software) ECC. This mode might be chosen for this, now better, ECC coverage mode.

Combined (2, 10)-RLL and (3, 10)RLL Code

The following is a description of a coding scheme that combines the following two encoders:

A (2, 10)-RLL encoder at rate 8:16 with 48.4% DC control. The encoder has four states, S0, S1, S2–5, and S6–8, and the encoding uses a table of 547 codewords, each of length 16 bits.

A (3, 10)-RLL encoder at rate 6:16 with 34.6% DC control. The encoder has four states, S1, S2, S3–5, and S6–8, and the encoding uses a table of 117 codewords, each of length 16 bits.

Each encoder has the structure described by Roth. However, the peculiarity of the proposed scheme is that the encoding table of the (3, 10)-RLL encoder is a sub-table of the (2, 10)-RLL encoder table. The codewords of the (3, 10)-RLL encoder are located at the addresses of the form 3+4n, where $0 \leq n < 117$.

The thresholds and prefixes of each encoder are summarized in Tables 1 and 2 below. Note that in Table 2, the value of b is obtained from the input 6-bit word by appending 11 as the two least-significant bits.

TABLE 1

Thresholds and prefixes for the (2,10)-RLL encoder.

| | Thresholds (decimal) | | Prefixes (binary) | | |
|---|---|---|---|---|---|
| State | T1 | T2 | $0 \leq b < T1$ | $T1 \leq b < T2$ | $T2 \leq b < 256$ |
| S0 | 000 | 000 | φ | φ | 00 |
| S1 | 010 | 121 | 01 | 01 or 00 | 00 |
| S2–5 | 035 | 054 | 10 or 01 | 01 | 01 or 00 |
| S6–8 | 035 | 177 | 10 or 01 | 01 | 01 or 00 |

TABLE 2

Thresholds and prefixes for the (3,10)-RLL encoder.

| | Thresholds (decimal) | | Prefixes (binary) | | |
|---|---|---|---|---|---|
| State | T1 | T2 | $0 \leq b < T1$ | $T1 \leq b < T2$ | $T2 \leq b < 256$ |
| S1 | 000 | 000 | φ | φ | 00 |
| S2 | 010 | 121 | 01 | 01 or 00 | 00 |

TABLE 2-continued

Thresholds and prefixes for the (3,10)-RLL encoder.

| | Thresholds (decimal) | | Prefixes (binary) | | |
|---|---|---|---|---|---|
| State | T1 | T2 | $0 \leq b < T1$ | $T1 \leq b < T2$ | $T2 \leq b < 256$ |
| S3–5 | 054 | 212 | 01 | 01 or 00 | 00 |
| S6–8 | 177 | 212 | 01 | 01 or 00 | 00 |

The value b is obtained from the input 6-bit word by appending 11 as least-significant bits.

As a matter of fact, the encoding procedure of the two encoders can be described in a unified manner, as summarized in Table 3. The value of ET should be set to 547 in case of (2, 10)-RLL encoding, and to 117.4=468 in case of (3, 10)-RLL encoding. The difference in the definition of the states in the two encoders can be overcome as follows: After determining the length of the last runlength of the previous (3, 10)-RLL codeword, subtract one from that runlength in case that runlength is three or less; then use the (2, 10)-RLL coding procedure.

TABLE 3

Encoding procedures for the (2,10)-RLL and (3,10)-RLL encoders.

| State | | address = b, except that address = b + 256 | Alternate codeword located at alt_address = |
|---|---|---|---|
| (2,10)-RLL | (3,10)-RLL | when | address + 256 when |
| S0 | S1 | never | never |
| S1 | S2 | b < 010 | alt_address < 377 |
| S2–5 | S3–5 | b < 054 | alt_address < ET |
| S6–8 | S6–8 | b < 177 | alt_address < ET |

The value ET is 547 in case of (2, 10)-RLL encoding, and 468 in case of (3, 10)-RLL encoding.

The two encoders have the same decoder. In the (3, 10)-RLL case, the two least significant decoded bits (equaling 11) should be deleted to form the input 6-bit word.

The bit pattern 0001000100010001000100010001 will never occur in the coded bit stream and can therefore be used for synchronization.

Here are some features of the table:

The parity of codewords that are located at 256 addresses apart is always different.

The terminal state of codewords that are located at 256 addresses apart is the same in both encoders (for the (3, 10)-RLL encoder, this applies to the codewords at addresses of the form 3+4n, $0 \leq n < 117$).

The table contains all but nine 16-bit words in the (2, 10)-RLL constraint whose last runlength is 0–8. The words 1111, 4444, and 8888 were deleted so that the synchronization sequence will not appear in the encoded stream. The words 8090, 8110, 8111, 8421, 8810, 8812 were deleted due to parity mismatch.

The 10-word block starting at address 000 can be accessed by the (2, 10)-RLL encoder only from state S0. Those addresses contain a) all four codewords whose first runlength is 10; b) two codewords (at addresses 003 and 007) whose first runlength is 9; and c) the four codewords 2220, 2221, 2222, and 2224. The codewords in category b) were put there to allow 64 codewords (in addresses 3+4n, $0 \leq n < 64$) to be generated from state S1 in the (3, 10)-RLL encoder. The codewords in category c) are inaccessible from state S1 in both encoders so that the synchronization sequence will not be appear in the encoded stream.

The 44-word block starting at address 010 contains codewords whose first runlength is 6–9, making this block accessible from states S0 and S1 in the (2, 10)-RLL encoder. However, that word block does not contain codewords that start with a runlength 9 in any of the addresses 3+4n, $2 \leq n < 13$, so the block is also accessible from states S1 and S2 in the (3, 10)-RLL encoder.

The rest of the table is divided into blocks starting at addresses 054, 177, 256, and 377, where each block, respectively, contains codewords whose first runlength is 3–5, 2, 1, and 0.

Addresses of the form 3+4n, $0 \leq n < 117$, contain all but 36 words in the (3, 10)-RLL constraint whose last runlength is 1–8.

The following 15 codewords in the (3, 10)-RLL constraint appear in the table, but are located at addresses which are not of the form 3+4n (therefore, these codewords are inaccessible by the (3, 10)-RLL encoder). Those codewords were redundant given the design constraint that the table of the (3, 10)-RLL encoder is a sub-table of the (2, 10)-RLL encoder: 0044, 0108, 0204, 0220, 0222, 0444, 0822, 0840, 0844, 0880, 0882, 0884, 1042, 1080, 2204.

The following 17 codewords in the (3, 10)-RLL constraint are also located at addresses which are not of the form 3+4n. Those codewords, however, were put there because of parity clash or terminal-state mismatch between codewords that are 256 addresses apart: 8040, 8042, 8044, 8080, 8082, 8084, 8100, 8102, 8104, 8108, 8202, 8402, 8404, 8802, 8804, 8808, 8820. (In addition, the four words 4444, 8888, 8110, and 8810 do not appear in the table at all.)

It is understood that the above description is intended to be illustrative and not restrictive. For example, the coding system may be based on other constraints than the (d,k)-RLL constraint. Further, the arrangement of codewords or table size may vary. For example, the table size may vary dependent on the number of states split, merged, and deleted. Further, depending on the design, there may be more than one alternative codeword candidate. The scope of the invention should therefore not be determined with reference to the above description, but instead should be determined with reference to the appended claims, along with the full scope of equivalents to which such claims are entitled.

What is claimed is:

1. An apparatus for processing coded digital data, the apparatus comprising:
    a first decoder to decode the coded data according to a first runlength-limited (RLL) constraint; and
    a second decoder to decode the coded data according to a second RLL constraint wherein the second decoder is a cascading of the first decoder.

2. The apparatus as recited in claim 1, wherein the first and second decoders use a single coding table, and wherein a subset of the coding table is used for the second decoder.

3. The apparatus as recited in claim 1, wherein the second decoder is a cascading of the first decoder and a mapping such that the mapping operates on output from the first decoder.

4. The apparatus as recited in claim 3, wherein the mapping operates on output from the first decoder by removal of bits in fixed and pre-specified locations.

5. The apparatus as recited in claim 1, wherein the first RLL constraint is (3,10) runlength limited and the second RLL constraint is (2,10) runlength limited.

6. The apparatus as recited in claim 1, comprising a reader to read the coded data from a recording medium, and wherein the first and second RLL constraints correspond to different data densities associated with the recording medium.

7. The apparatus as recited in claim 6, comprising a low density recorder to record the coded data onto the recording medium at a low data density.

8. The apparatus as recited in claim 1, wherein the first and second RLL constraints correspond to different polarities associated with recording marks on the recording medium.

9. The apparatus as recited in claim 1, comprising a first encoder to encode the coded data according to the first RLL constraint.

10. The apparatus as recited in claim 1, comprising a second encoder to encode the coded data according to a second RLL constraint.

11. The apparatus as recited in claim 1, comprising:
    a reader to read the coded data from a recording medium; and
    a recorder to record the coded data onto the recording medium.

12. An apparatus for processing digital data, the apparatus comprising:
    an encoder to encode the digital data according to a first run-length limited (RLL) constraint, the encoding of the digital data producing coded data that satisfies the first RLL constraint and, by altering bits in fixed and pre-specified locations, the output of the encoder satisfies a second RLL constraint; and
    a recorder to record the coded data onto a recording medium.

13. The apparatus as recited in claim 12, wherein if input to the encoder is set to fixed bits in fixed and pre-specified locations, a second encoder is obtained for the second RLL constraint.

14. The apparatus as recited in claim 12, further comprising a first decoder for the first RLL constraint and a second decoder for the second RLL constraint.

15. The apparatus as recited in claim 12, wherein the first RLL constraint is (3,10) run-length limited.

16. The apparatus as recited in claim 12, wherein the first RLL constraint is (2,10) run-length limited.

17. A method for processing coded digital data, the method comprising the steps of:
    decoding the coded data according to a first run-length limited (RLL) constraint; and
    decoding the coded data according to a second RLL constraint wherein the second decoder is a cascading of the first decoder.

18. A method for processing digital data, the method comprising the steps of:
    encoding the digital data according to a first run-length limited (RLL) constraint, the encoding of the digital data producing coded data that satisfies the first RLL constraint and, by altering bits in fixed and pre-specified locations, the output of the encoder satisfies a second RLL constraint; and
    recording the coded data onto a recording medium.

19. An apparatus for processing digital data, the apparatus comprising:
    an encoder to encode the digital data according to a first run-length limited (RLL) constraint, the encoding of the digital data producing coded data that satisfies the first RLL constraint and, by altering bits in fixed and pre-specified locations, the output of the encoder satisfies a second RLL constraint;
    a recorder to record the coded data onto a recording medium; and
    a first decoder for the first RLL constraint and a second decoder for the second RLL constraint wherein the first and second decoders use a single coding table, and wherein a subset of the coding table is used for the second decoder.

20. The apparatus as recited in claim 19, wherein the second decoder is a cascading of the first decoder and a mapping such that the mapping operates on output from the first decoder.

21. The apparatus as recited in claim 20, wherein the mapping operates on the output from the first decoder by removal of bits in fixed and pre-specified locations.

* * * * *